(12) United States Patent
Zwittig

(10) Patent No.: US 7,913,751 B2
(45) Date of Patent: Mar. 29, 2011

(54) MICRO-HEAT EXCHANGER

(75) Inventor: Eberhard Zwittig, Hochdorf (DE)

(73) Assignee: Behr GmbH & Co. KG, Stuttgart (DE)

( * ) Notice: Subject to any disclaimer, the term of this patent is extended or adjusted under 35 U.S.C. 154(b) by 826 days.

(21) Appl. No.: 11/815,598

(22) PCT Filed: Jan. 16, 2006

(86) PCT No.: PCT/EP2006/000307

§ 371 (c)(1),
(2), (4) Date: Aug. 6, 2007

(87) PCT Pub. No.: WO2006/089597

PCT Pub. Date: Aug. 31, 2006

(65) Prior Publication Data

US 2008/0142191 A1  Jun. 19, 2008

(30) Foreign Application Priority Data

Feb. 22, 2005 (DE) .................. 10 2005 008 271

(51) Int. Cl.
*F28F 3/04* (2006.01)
(52) U.S. Cl. ...................... 165/170; 165/167
(58) Field of Classification Search .............. 165/166, 165/167, 170
See application file for complete search history.

(56) References Cited

U.S. PATENT DOCUMENTS

| | | | | |
|---|---|---|---|---|
| 4,516,632 A | * | 5/1985 | Swift et al. | 165/167 |
| 5,152,060 A | | 10/1992 | Schubert et al. | |
| 6,220,497 B1 | | 4/2001 | Benz et al. | |
| 6,230,408 B1 | | 5/2001 | Ehrfeld et al. | |
| 2002/0125001 A1 | * | 9/2002 | Kelly et al. | 165/165 |
| 2003/0178178 A1 | | 9/2003 | Breuer et al. | |
| 2004/0066625 A1 | | 4/2004 | Meyer et al. | |

FOREIGN PATENT DOCUMENTS

| | | |
|---|---|---|
| DE | 37 09 278 | 9/1988 |
| DE | 43 15 580 | 11/1994 |
| DE | 196 08 824 | 9/1997 |
| DE | 198 01 374 | 3/1999 |
| DE | 199 17 521 | 11/2000 |
| DE | 100 17 971 | 10/2001 |
| DE | 100 10 397 | 12/2001 |
| DE | 102 46 990 | 4/2004 |
| WO | WO 03/080233 | 10/2003 |

\* cited by examiner

*Primary Examiner* — Teresa J Walberg
(74) *Attorney, Agent, or Firm* — Leydig, Voit & Mayer, Ltd.

(57) ABSTRACT

The invention concerns a micro-heat exchanger having a microstructure of channels (2) arranged at least in one matrix element (1) in the form of a plate and circulating at least one coolant, said matrix element (1) having upper and lower surfaces (5, 6) as well as lateral surfaces (3, 4). The invention is characterized in that the channels (2) are open on the upper surface (5) and/or on the lower surface (6) and closed on the lateral surfaces (3, 4).

17 Claims, 6 Drawing Sheets

Figure 1:
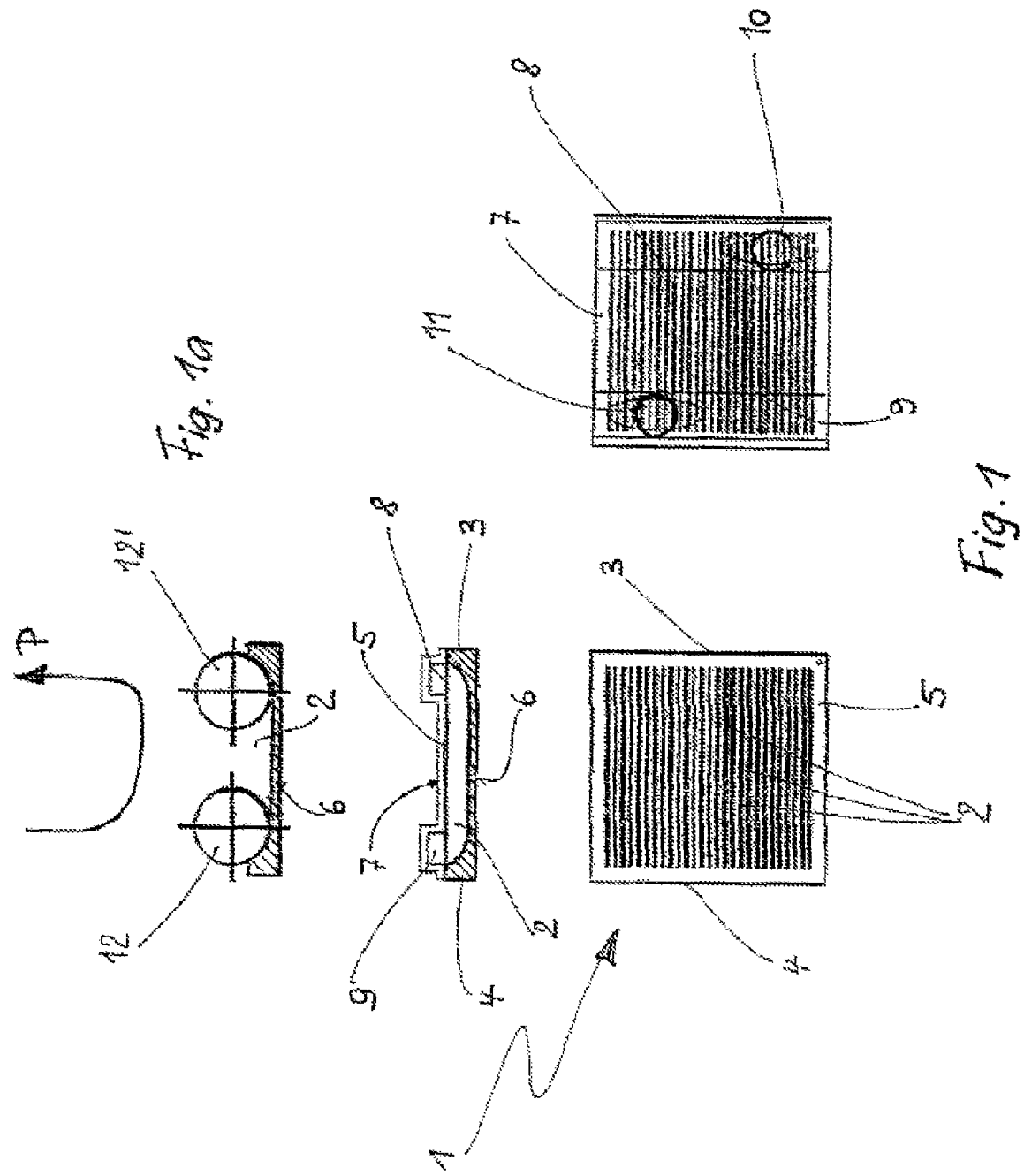

Key: 1 Capacity
2 Ridge width b in (mm)
3 Micrograp
4 Gap width (mm)

MICRO-HEAT EXCHANGER

The invention pertains to a micor-heat exchanger including microchannels that are arranged in a least one plate-shaped matrix element and through which at least one heat transfer medium circulates.

Micro-heat exchangers are heat exchangers with a fine structure or microstructure of channels, i.e., microchannels, whose dimensions lie in the sub-millimeter range. This makes it possible to realize a large heat transfer surface within the smallest possible space. Micro-heat exchangers of this type serve, e.g., for cooling components used in power electronics—as described in DE 100 17 971 A1.

Micro-heat exchangers are composed of a plurality of plates stacked one on top of another and in which the microchannels are produced with suitable processing methods. In DE 37 09 278 A1, the microchannels are machined in the form of grooves on the order of hundredths of a millimeter with diamond cutting tools. Here, the channels extend continuously from one side to the opposite side of a plate element, i.e., the channels are open toward the top and sides. In a stack of such plates, the connections for the flow medium consequently are arranged laterally and sealed relative to the side surfaces.

A similar design of a micro-heat exchanger has been disclosed in DE 198 01 374 C1, wherein this micro-heat exchanger has larger dimensions, i.e., channel depths between 0.1 and 0.4 mm, channel widths between 0.1 and 10 mm and ridge widths between 0.1 and 10 mm. The channels are formed in sheet metal and run laterally out of the sheets, which are stacked one on top of another. The sheets are interconnected by means of soldering and thus form a micro-heat exchanger block that is realized, for example, in the form of a countercurrent heat exchanger.

The disadvantage of known micro-heat exchangers is the lateral arrangement of the connections for the cooling medium or the flow media.

The present invention is based on the objective of developing a micro-heat exchanger of the initially cited type that has a simplified design and an improved heat transfer capacity.

This objective is realized with a micro-heat exchanger including channels (microchannels) that are produced in a plate-shaped matrix element either from the top or from the bottom or from both plate sides such that the channeled are laterally closed. The flow medium therefore is only able to flow into the channels of the matrix element from above or from below or—in the case of two flow media—from above and from below. The matrix element is realized in one piece with the channels or channel walls, respectively, wherein the channels are produced in the matrix element by means of conventional cutting or non-cutting methods, e.g., milling with a side mill or end mill, broaching, high-pressure metal forming, diecasting and/or injection molding. The connections for the flow medium or media therefore are preferably arranged on the upper side or on both sides.

In an advantageous development of the invention, the top and/or the bottom of such a matrix element is closed with a cover plate. The cover plate therefore closes the open channels and can be connected to the matrix element by means of soldering or bonding.

In another advantageous development of the invention, distribution channels are integrated into the matrix element or the cover plates and communicate with the (micro)channels, wherein said distribution channels collect and distribute the flow medium and are connected to a connector for the flow medium. Micro-heat exchangers of this type with only one flow medium, namely a coolant, can be used, for example, for cooling electronic components, wherein the smooth underside of the matrix element is thermally conductively connected to the housing of the electronic component, while a coolant, for example, a water-glycol mixture, flows through the microchannels arranged on the upper side. In this application, it is particularly advantageous to arrange the coolant connections on the upper side.

According to an advantageous refinement of the invention, the geometry of the microchannels is characterized by specific dimensions, wherein the channel or gap width preferably lies in the range of 0.1 to 0.3 mm, particularly 0.1 to 0.2 mm, and the channel height lies in the range of 2 to 5 mm, particularly 3 to 5 mm. The channel cross section is therefore realized rectangularly, wherein the ratio of the lengths of two sides lies in the range of 15 to 50. This channel geometry results in a large heat transfer surface within a small space and therefore in a high heat transfer capacity. It is advantageous that the ridges that are respectively arranged between the microchannels or microgaps have a ridge width in the range of 0.1 to 0.8 mm, preferably in the range of 0.1 to 0.2 mm; a maximum heat transfer capacity is affected with this latter range (in this respect, see also the diagram according to FIG. 6).

According to an advantageous refinement of the invention, the matrix elements are layered one on top of another to form a stack, wherein the microchannels are connected one to another, for example, in parallel or in series. The stack is closed and sealed on its upper side with a cover sheet and on its lower side with a bottom sheet. If the individual matrix elements feature channels on their upper and lower sides, intermediate sheets are arranged between the matrix elements in order to seal one matrix element relative to the adjacent matrix element and therefore relative to the other fluid. The connections for the flow media are also arranged on the upper side in this stacked design.

Metals, alloys, plastics or ceramics may be respectively considered as materials for the matrix element and the cover sheet.

Figure 2:
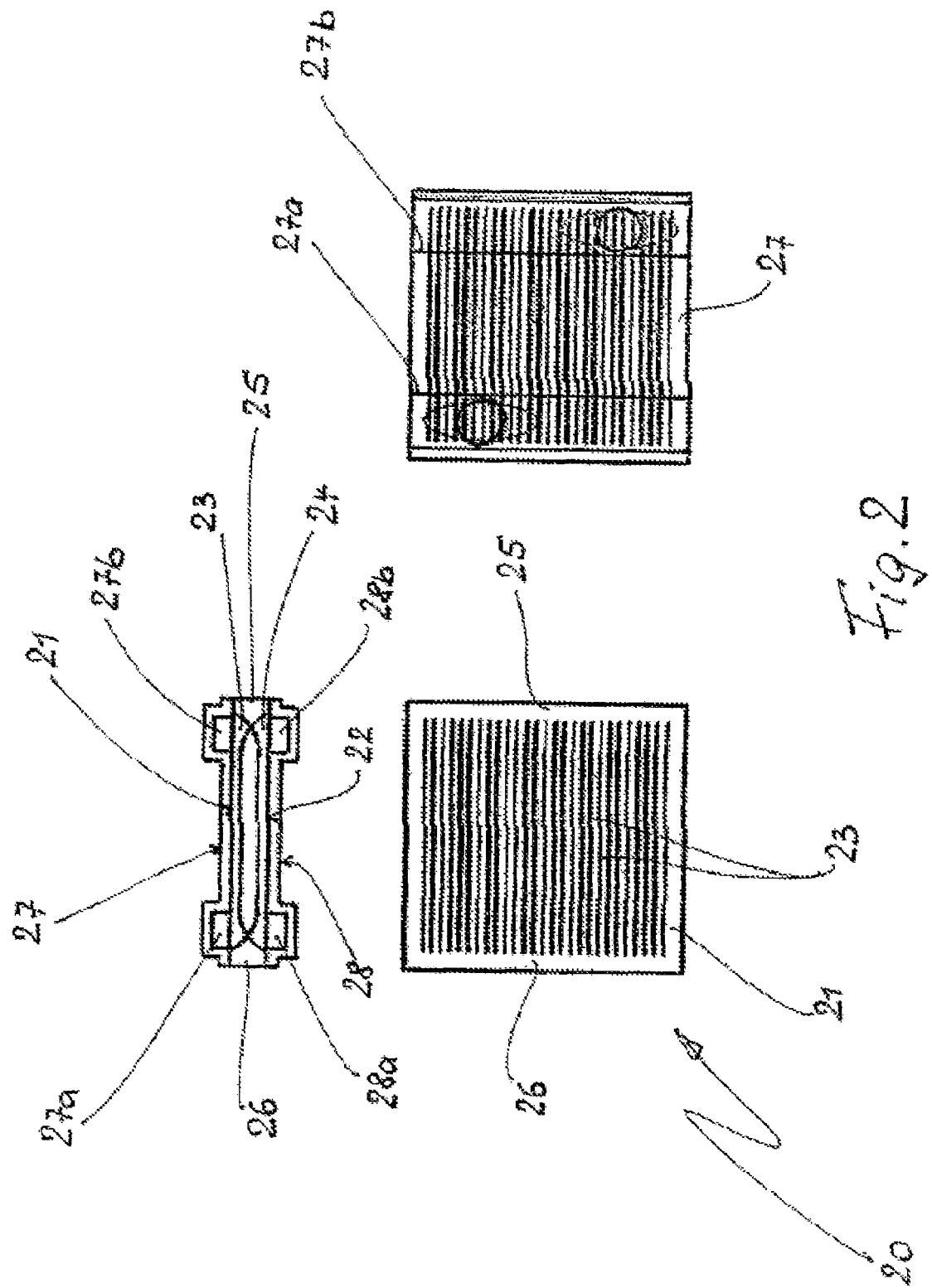
Figure 3:
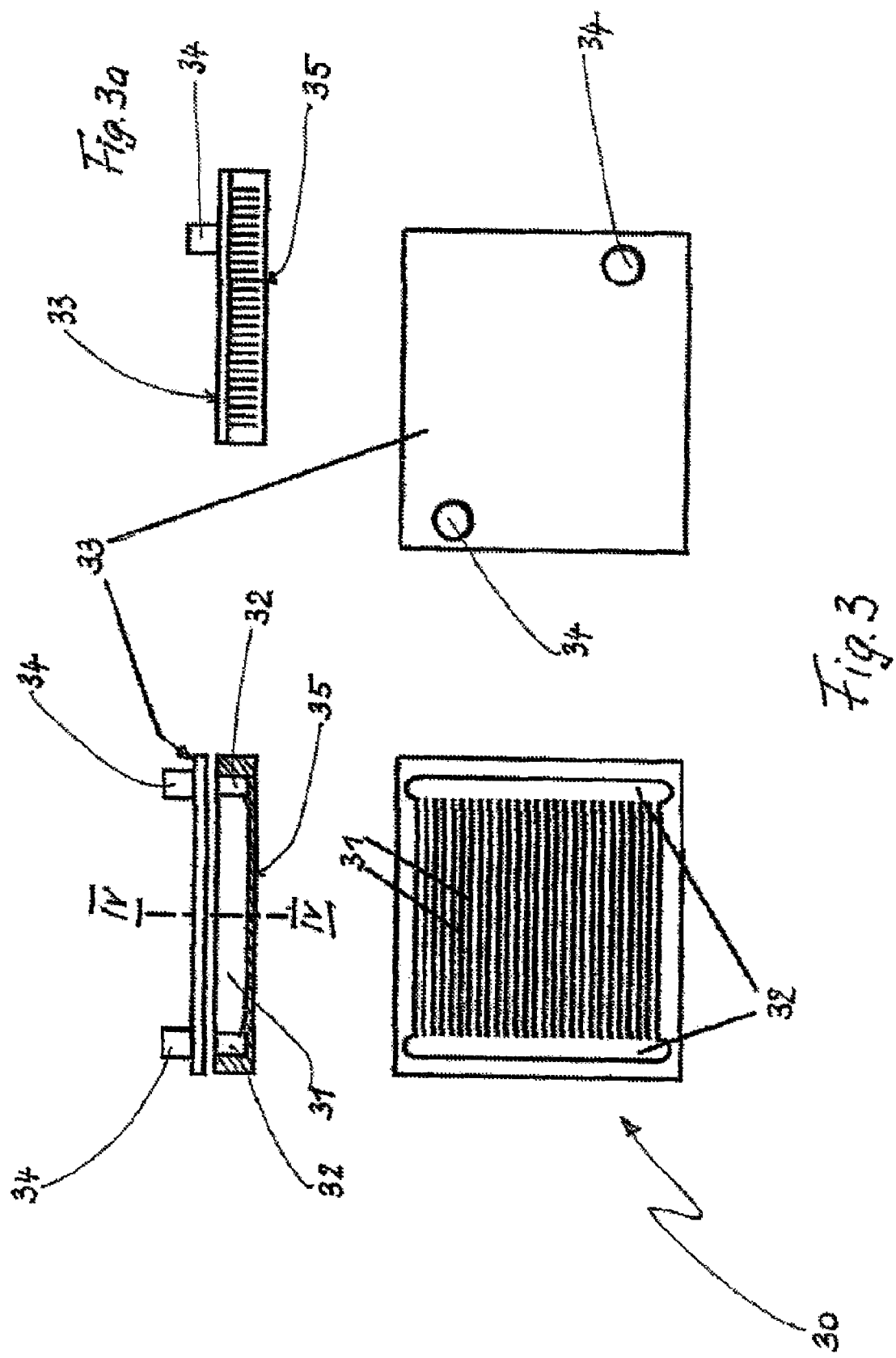
Figure 4:
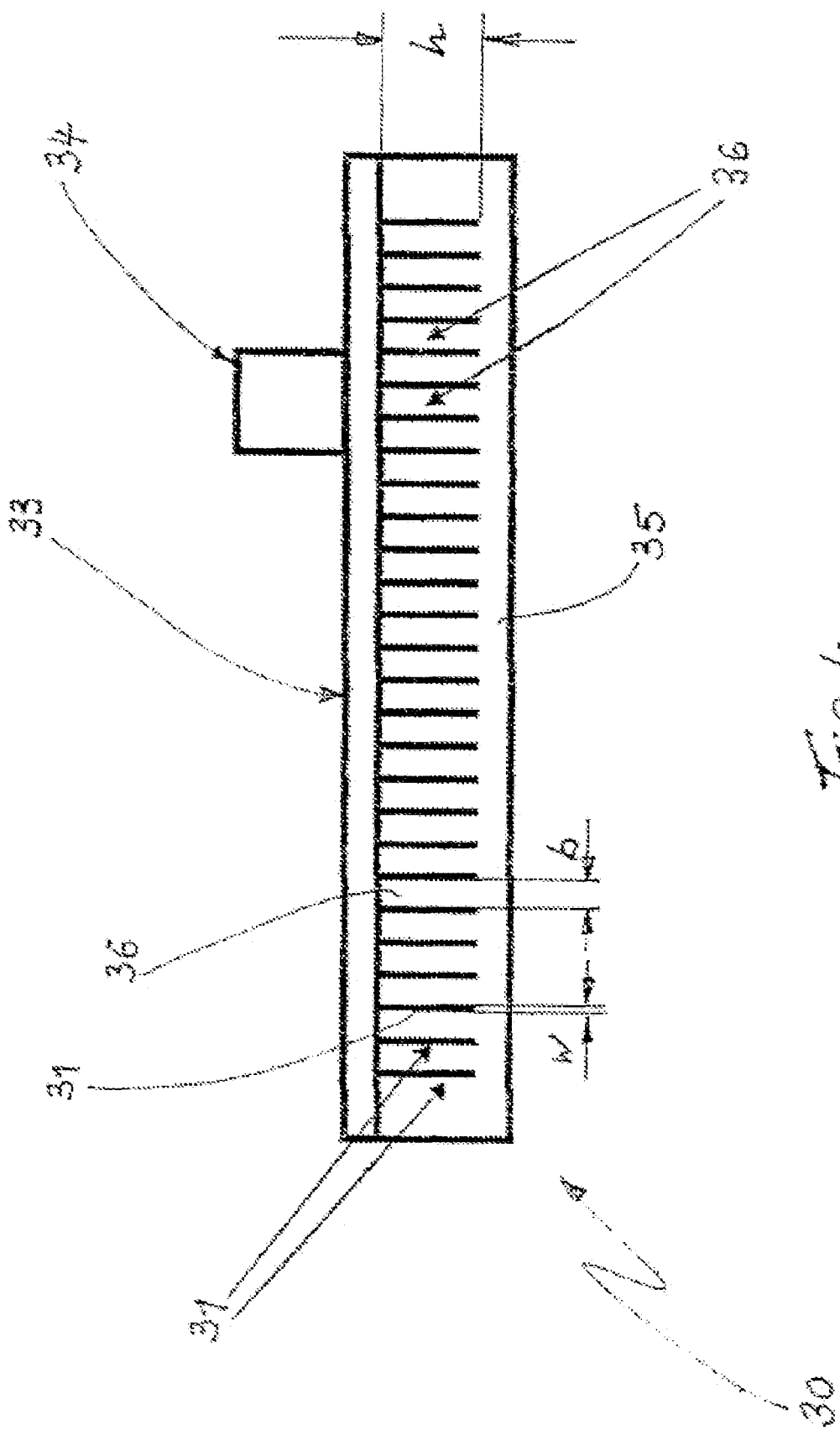
Figure 5:
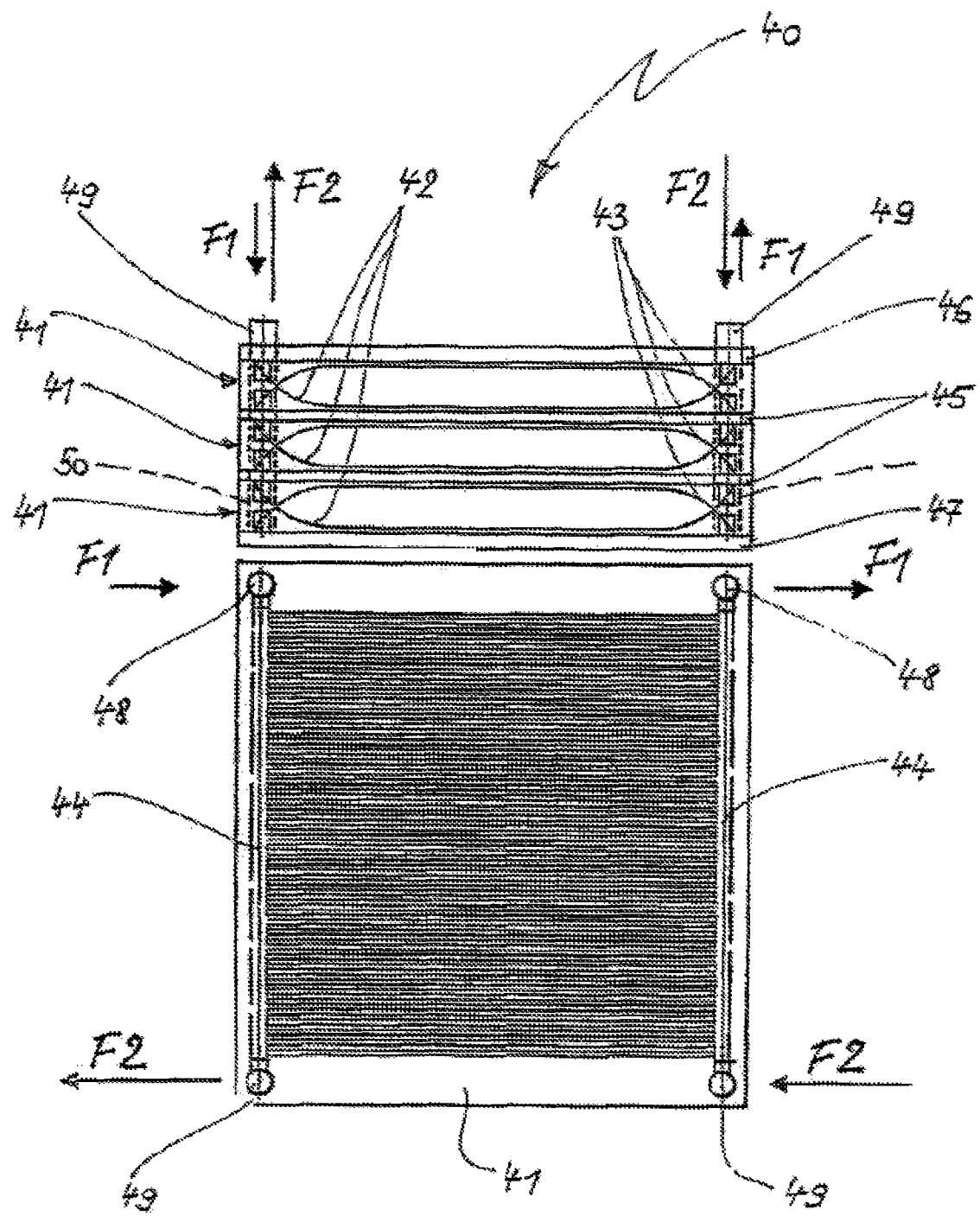
Figure 6:
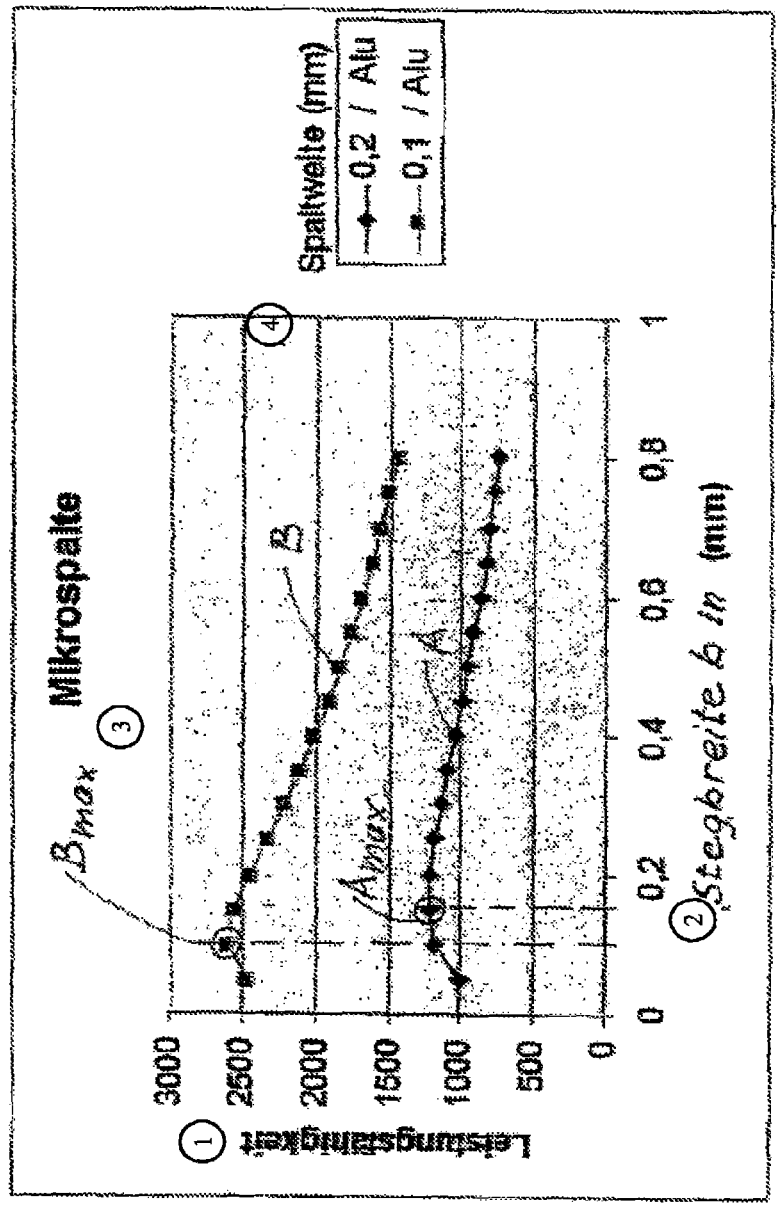

Embodiment examples of the invention are illustrated in the drawing and described in greater detail below. The drawing shows:

FIG. 1, a first embodiment example of an inventive matrix element with microchannels for a flow medium arranged on one side;

FIG. 1a, a method for producing the microchannels in the matrix element according to FIG. 1;

FIG. 2, a second embodiment example of an inventive matrix element with channels for two flow media arranged on alternating sides;

FIG. 3, a third embodiment example of an inventive matrix element with integrated distribution channels;

FIG. 3a, a cross section through the matrix and the flow channels;

FIG. 4, an enlarged cross section along plane IV-IV with channel geometry;

FIG. 5, a micro-heat exchanger for two flow media that is composed of individual matrix elements, and FIG. 6, a diagram that shows the heat transfer capacity as a function of channel width and ridge width.

FIG. 1 shows a plate-shaped, square matrix element 1 with a plurality of microchannels 2 that are arranged parallel to one another and limited with respect to their length, i.e., outwardly closed, by side walls 3, 4 of the matrix element 1. The matrix element 1 features an upper side 5, wherein the channels 2 are open at this upper side. The underside 6 of the matrix element is realized smooth. The open upper side 5 of the matrix element 1 is closed with a cover 7, in which distribution channels 8, 9 are arranged laterally and parallel to the lateral surfaces 3, 4. Connections 10, 11 for a flow medium are arranged in the distribution channels 8, 9 and serve for supplying and discharging the flow medium. The flow medium, e.g., a coolant, is therefore distributed over the individual microchannels 2 by the distribution channel 8 (or 9), flows through the matrix element 1 and is subsequently collected in the other flow channel 9 (or 8) and discharged outwardly. Such a matrix element may be used, for example, as a cooling device for cooling electronic components by thermally conductively mounting the smooth underside 6 on a corresponding (not-shown) surface of the electronic component. The generated heat is then carried off by the coolant, e.g., a water-glycol mixture, flowing through the channels 2.

FIG. 1a shows one option for manufacturing the inventive microchannels 2: a disk-shaped mill 12 is moved into the starting position, wherein the infeed of the mill is directed perpendicular to the upper side 5. After the required channel height or channel depth is reached, the side mill 12 is moved into the end position 12' toward the right in the figure, i.e., parallel to the upper and lower sides 5, 6, and subsequently pulled out of the channel 2 vertically. The infeed and advance movement of the mill 12, 12' is indicated by an arrow P. Due to the plurality of parallel channels 2, the mill 12 may be realized in the form of a roller consisting of a plurality of individual disks. This method ensures that the side walls 3, 4 remain standing so that the channels 2 are closed on the surface side. The matrix element 1 is therefore realized in one piece with the channels 2. The cover plate 7 may be integrally connected to the matrix element 1, e.g., by means of bonding, soldering or welding or by means of a screw connection.

FIG. 2 shows another embodiment example of the invention with a matrix element 20 that features an upper side 21 and a lower side 22, wherein channels 23, 24 that correspond to the channels 2 described above with reference to FIG. 1 are respectively machined into the upper side and the lower side of the matrix element. The channels 21, 22 are therefore laterally closed by side walls 25, 26. The open upper side 21 and the open lower side 22 are respectively closed with a cover plate 27 that features distribution channels 27a, 27b and a cover plate 28 that features distribution channels 28a, 28b, so that two media can flow through the matrix element 20 in the form of a co-current or a countercurrent, wherein corresponding connections for the flow media are situated in the region of the distribution channels 27a, 27b, 28a, 28b, but not identified by assigned reference symbols.

FIG. 3 shows another embodiment example of the invention with a matrix element 30 that features flow channels 31, to which distribution channels 32 are assigned on the surface side. The channels 31 are open at one side and closed with a cover plate 33 that features connections 34 for a flow medium in the region of the distribution channels 32. The bottom 35 of the matrix element 30 is realized smooth on its outer side. This matrix element 30 can also be advantageously used for cooling electronic components, e.g., a PC processor.

FIG. 3a shows a cross section through the matrix element 30 with a cover 33.

FIG. 4 shows the section illustrated in FIG. 3a along plane IV-IV. The flow channels 31 realized in the form of microgaps extend upwards, i.e., in the direction of the cover 33, from the continuous bottom region 35 that is realized smooth on its outer side, wherein the flow channels have a height h and a channel or microgap width w. Ridges 36 with a ridge width b are arranged between the microgaps 31—the ridge width b therefore corresponds to the distance between adjacent microgaps 31. The ridges 36 are realized in one piece with the bottom region 35. In one preferred embodiment of the invention, the gap width w is chosen in the range of 0.1 to 0.2 mm and the height h of the microgaps 31 (channels) lies in the range of 3 to 5 mm. The ratio of gap height to gap width therefore lies in the range of 15 to 50. The ridge width b preferably lies in the range of 0.1 to 0.8 mm, particularly in the range of 0.1 to 0.2 mm. The heat transfer capacity illustrated in the diagram according to FIG. 6 is achieved with this gap geometry.

FIG. 5 shows another embodiment example of the invention in the form of a micro-heat exchanger 40 that is composed of individual matrix elements 41 arranged one on top of another. The matrix elements 41 feature microchannels 42 on the upper side and microchannels 43 on the lower side and are respectively connected to distribution channels 44 integrated into the matrix element 41 on the surface side. Intermediate sheets 45 arranged between the matrix elements 41 separate the upper-side and lower-side channels of adjacent matrix elements 41. The stack of matrix elements 41 is closed at the top with a cover sheet 46 and toward the bottom with a bottom sheet 47. Two media circulating through the micro-heat exchanger 40 are supplied and discharged through the connections 48, 49. The individual matrix elements 41 and their respective channels 42, 43, which convey various media, are connected to one another via transverse bores 50 (designated by the broken lines) in the matrix elements 41 and in the intermediate sheets 45. The inlets and outlets for both media are indicated by arrows F1, F2 (Fluid 1, Fluid 2). All parts may be integrally interconnected to form a block.

FIG. 6 shows a diagram in which the capacity of the microgaps (see microgap 31 in FIG. 4) is plotted as a function of the ridge width b. A first, lower curve A shows the capacity for an aluminum material with a gap width w=0.2 mm. A second, upper curve B shows the capacity of an inventive micro-heat exchanger with microgaps that have a gap width w=0.1 mm, namely also for an aluminum material. A comparison of the two curves A, B shows that the maxima $A_{max}$ and $B_{max}$ have a relative offset along the X-axis: the maximum $B_{max}$ results for a gap width of approximately 0.1 mm, whereas the maximum $A_{max}$ applies to the greater ridge width of approximately 0.15 mm. It can therefore be stated that the gap with w is correlated to the ridge width b, i.e., a small gap width does not produce a maximum at a large ridge width. On the other hand, the ridge width b must lie close to the gap widths in order to achieve maximum capacity.

The invention claimed is:

1. A micro-heat exchanger comprising microchannels that are arranged in at least one plate-shaped matrix element and through which at least one heat transfer medium circulates, the matrix element having an upper side and a lower side, as well as lateral surfaces, wherein each microchannel is open at one of the upper side and the lower side and closed at the lateral surfaces and has a depth that is smaller than the thickness of the respective plate-shaped matrix element such that the microchannel is closed at the other of the upper side and the lower side.

2. The micro-heat exchanger according to claim 1, comprising distribution channels in fluid communication with the microchannels, and inflow and outflow connections for the heat transfer medium.

3. The micro-heat exchanger according to claim 2, wherein the inflow and outflow connections are arranged on the upper side and/or on the lower side.

4. The micro-heat exchanger according to claim 2, further comprising a cover plate, wherein the upper side and/or lower side of the at least one matrix element is tightly closed with the cover plate.

5. The micro-heat exchanger according to claim 4, wherein the distribution channels are integrated into the cover plate.

6. The micro-heat exchanger according to claim 2, wherein the distribution channels are integrated into the at least one matrix element.

7. The micro-heat exchanger according to claim 1, wherein the microchannels have a channel width or microgap width w, wherein the following dimensions apply: $0.1 \leq w \leq 0.3$ mm.

8. The micro-heat exchanger according to claim 7, further comprising ridges, the ridges having a ridge width b, arranged between the channels, wherein the following dimensions apply: $0.1 \leq b \leq 0.8$ mm.

9. The micro-heat exchanger according to claim 8, wherein the gap width w and the ridge width b respectively lie in the range of 0.1 to 0.2 mm.

10. The micro-heat exchanger according to claim 7, wherein the following dimensions apply: $0.1 \leq w \leq 0.2$.

11. The micro-heat exchanger according to claim 10, wherein the following dimensions apply: $0.1 \leq b \leq 0.2$ mm.

12. The micro-heat exchanger according to claim 1, wherein the microchannels have a channel height h, wherein the following dimensions apply: $2 \leq h \leq 5$ mm.

13. The micro-heat exchanger according to claim 1, comprising several matrix elements arranged one on top of another forming a stack, wherein the microchannels communicate with one another via fluidic connections.

14. The micro-heat exchanger according to claim 13, further comprising the intermediate sheets arranged between the matrix elements of the stack, wherein the microchannels are open at the upper side and the lower side of a matrix element.

15. The micro-heat exchanger according to claim 14, further comprising a cover sheet, a bottom sheet, and inflow and outflow connection for heat transfer media, wherein the stack is closed at the top with the cover sheet and closed at the bottom with a bottom sheet, and wherein the inflow and outflow connections are in fluid communication with the stack.

16. The micro-heat exchanger according to claim 1, further comprising ridges, the ridges having a ridge width b, arranged between the channels, wherein the following dimensions apply: $0.1 \leq b \leq 0.8$ mm.

17. The micro-heat exchanger according to claim 16, wherein the following dimensions apply: $0.1 \leq b \leq 0.2$ mm.

* * * * *